April 17, 1962 G. GAUTHERIN 3,030,587

ELECTRICAL CONTROL CIRCUIT

Filed July 8, 1959

INVENTOR.
GEORGE GAUTHERIN

BY Darby & Darby

ATTORNEYS 3,030,587

ELECTRICAL CONTROL CIRCUIT

George Gautherin, Woodside, N.Y., assignor to Andrea Radio Corporation, Long Island City, N.Y., a corporation of New York Filed July 8, 1959, Ser. No. 825,708
5 Claims. (Cl. 330—145)

Figure 1:
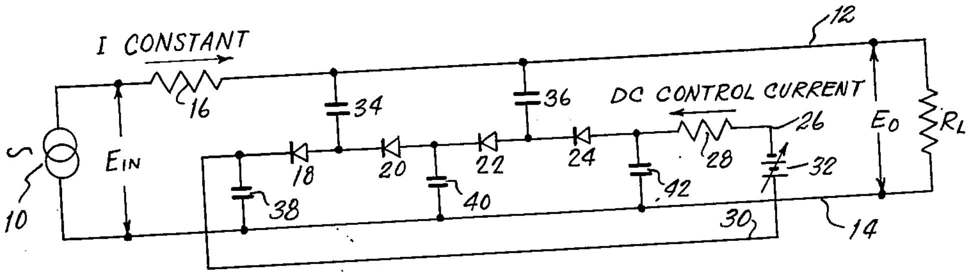

This invention is concerned with improvements in electrically controlled circuits.

One of the objects of the invention is to provide a variable load for a constant current alternating current source.

A further object of this invention is to employ two or more diodes whose direct current resistances are in series with a direct current control current source, while their alternating current resistances are arranged to present a parallel load to the constant current alternating current source.

A more specific object of this invention is to provide in such a circuit an arrangement wherein the magnitude of the alternating current impedance is a function of a direct current control current.

A further object of this invention is to provide circuits of this kind for greater control efficiency as compared with single diode circuits now used for this purpose.

Another object of this invention involves the application of the above circuit combination to a high gain AGC loop to keep the amplifier output voltage substantially constant when the input voltage varies over a wide range.

Another object of the invention is to apply the above circuit combination to an automatic gain control for an audio power amplifier actuated simultaneously by two audio signals, in a manner to keep the amplifier operation in its linear range, thereby avoiding cross modulation between the two signals.

A broad object of this invention is to minimize distortion and increase intelligibility of the output signals of an audio amplifier energized simultaneously by two or more audio signals.

Other and more detailed objects of the invention will be apparent from the following description thereof in connection with the attached drawings.

Figure 2:
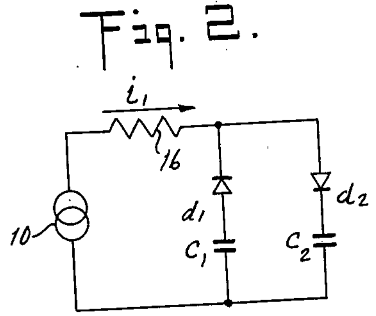
Figure 3:
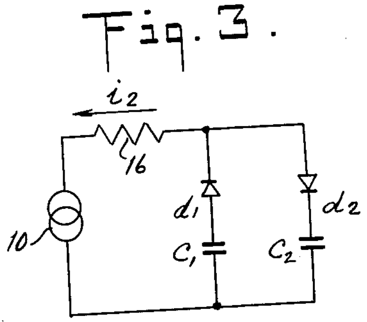
Figure 4:
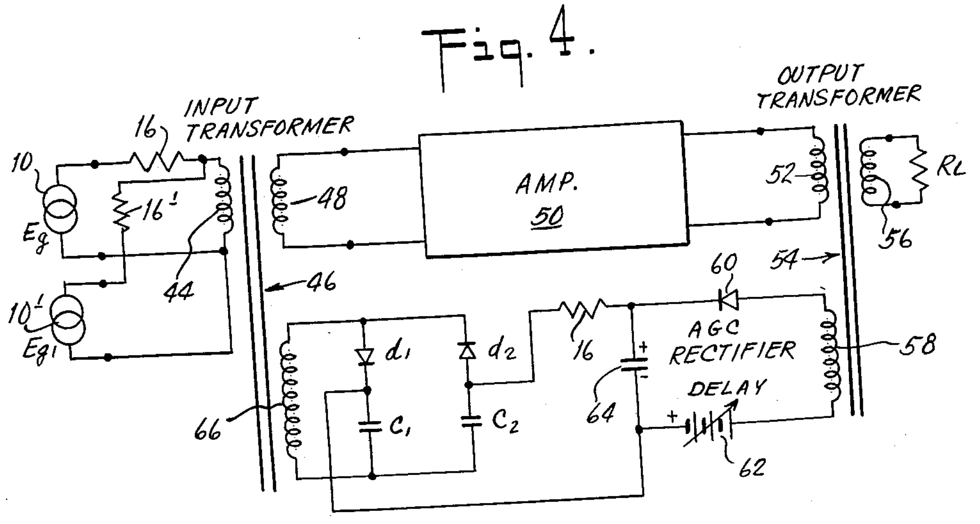

In the drawings,

FIGURE 1 shows the basic circuit combination of this invention in which the magnitude of the A.C. impedance thereof is a function of a D.C. control current;

FIGURES 2 and 3 diagrammatically illustrate the transfer efficiency of double diode combinations connected in accordance with this invention; and FIGURE 4 is a schematic and diagrammatic illustration of an audio amplifier to which this invention has been applied to prevent cross modulation when simultaneously energized with two audio signals.

An important object of this circuit is to provide a variable load for a constant current A.C. source. This circuit consists principally of two or more diodes, in the case of FIG. 1, whose D.C. resistances are in series with a direct control source, while their A.C. resistances presents a parallel load to the constant current A.C. source. As a result the magnitude of the A.C. impedance of the circuit is a function of the D.C. control current.

Referring to FIG. 1, at 10 is diagrammatically shown an alternating current source, one terminal of which is connected by a lead 12, including the resistor 16, to one terminal of a load diagrammatically illustrated at $R_L$. The other terminal of the source 10 is connected by the lead 14 to the other terminal of the load. At 18, 20, 22 and 24 are diodes connected in series, one terminal of this series assembly being connected by the lead 26 through the resistor 28 to one terminal of the direct current control source 32. The other terminal of the direct current control source 32 is connected by lead 30 to the other terminal of the diode series assembly. The diodes are connected respectively in parallel to the A.C. source 10, through the blocking capacitors 34 to 42 inclusive. As those skilled in the art will appreciate, this provides in the arrangement shown, four series connected diodes having their D.C. resistances in series with the source 32 and their A.C. resistances in parallel to the source 10. As a result, for each current setting of the source 32 the A.C. impedance of the circuit is a function thereof.

This circuit has the advantage that it offers a greater control efficiency as compared to a single diode circuit of the same general type. If the diodes have approximately the same volt-ampere transfer characteristic and Z is their A.C. resistance at a given D.C. control current, the parallel load to the A.C. constant current source 10 is $Z/n$ plus the series-parallel impedance of the capacitors in the circuit. "$n$" is the number of diodes in the circuit.

As illustrated in FIGS. 2 and 3, where the circuit includes an even number of diodes its transfer characteristic becomes symmetrical as represented by the following equation:

$$\left[\frac{Zd_1Zd_2}{Zd_1+Zd_2}\right]_{i_1}=\left[\frac{Zd_1Zd_2}{Zd_1+Zd_2}\right]_{i_2}$$

if $i_1=l_2$ thereby minimizing second harmonic distortion in audio applications of the circuit.

There is illustrated in FIG. 4 one application of the idea of this invention. As shown there it is used in an amplifier with a high gain AGC loop as an AGC system which keeps the output voltage $E_o$ substantially constant where the input voltage $E_g$ varies over a wide range. This circuit also illustrates the use of the diode circuit of this invention to apply automatic gain control to an audio power amplifier energized by two audio signals simultaneously. The purpose of this arrangement is to keep the amplifier operation in the linear region so that no cross modulation can take place between the two signals.

As those skilled in the art will understand when two audio signals, which are equal or almost equal in amplitude, are being amplified by the same power amplifier and the amplifier is delivering its peak power in a manner to force it to go into clipping the audio signals will cross modulate each other and produce high distortion. Under this condition both audio signals will be distorted and their intelligibility will be greatly impaired.

By applying automatic gain control to the amplifier, it can be adjusted by means of a delay circuit to stay out of the region of distortion. The automatic gain control action is developed only near the peak amplifier output by one of the audio signals, the one of higher amplitude. This reduces the amplifier gain and prevents it being driven into the non-linear or distortion region.

As shown in FIG. 4 there are two audio signal sources 10 and 10' connected respectively across the primary winding 44 of an input transformer 46 through the resistors 16 and 16' respectively. The secondary winding 48 of this transformer is connected to the input of the audio power amplifier 50. Its output is fed by means of the input winding 52 of the output transformer, its output winding 56 connected to a work circuit or load $R_L$.

The output transformer 54 has a second output winding 58 which is connected in series through the diode 60 of the automatic gain control rectifier and a delay circuit (an adjustable voltage source 62, for example) to the input terminals of the multiple diode control circuit of this invention. The input terminals of this assembly are shunted by a capacitor 64. The diode assembly in this case comprises a pair of diodes $d_1$, $d_2$ connected in series with the output of the AGC rectifier and in parallel to a winding 66 forming part of the input transformer 46. The blocking condensers $C_1$ and $C_2$ are provided as in the case of the previous circuits. Here, as in the case of FIG. 1, the D.C. resistance of the diodes $d_1$ and $d_2$ are in series with the D.C. control current supplied by the AGC rectifier. Their A.C. resistance presents a parallel load to the A.C. current sources 10 and 10'.

Depending upon the adjustment of the delay circuit 62, the automatic gain control current of the AGC rectifier keeps the amplifier in the linear region.

From the above description it will be apparent to those skilled in the art that the details of this invention are capable of some variation without departure from the novel subject matter thereof. It is desired, therefore, that the circuits illustrated in the figures be taken in an exemplary sense and that the scope of protection afforded hereby be determined by the appended claims.

What is claimed is:

1. The combination comprising a source of alternating current signals, amplifier means having an input and an output for amplifying said alternating current signals, transformer means having a first winding connected to said alternating current signal source and a second winding connected to the input of said amplifier means for applying said alternating current signals to the input of said amplifier means, means connected to the output of said amplifier means for converting a portion of the alternating current signals appearing thereon into a direct current voltage signal whose magnitude varies in accordance with the magnitude of the alternating current signals at the output of said amplifier means, a third winding for said transformer, a plurality of diodes, each diode having an impedance which varies in accordance with a varying direct current voltage applied thereto, means for electrically connecting said plurality of diodes in parallel with said third transformer winding, the impedance of the third winding reflected back to said first winding varying in accordance with the changing impedances of said diodes, means electrically connecting said converting means and said diodes for applying the direct current voltage signal to said diodes to control their respective impedances, the change of impedance of said third winding produced by variation of the impedances of the diodes being reflected back to said first winding of said transformer thereby controlling the magnitude of the signals from said alternating current signal source applied to the input of said amplifier means.

2. The combination as set forth in claim 1 wherein a second alternating current signal source is provided, a fourth winding for said transformer, means connecting said fourth winding to said second signal source, the signal from said second source being coupled from the fourth winding to the second winding and applied to the input of said amplifier means, the variation of impedance of said third winding also being reflected into said fourth winding thereby controlling the magnitude of the signal from said second signal source applied to the input of said amplifier means.

3. The combination as set forth in claim 1 wherein a capacitor respectively connects each of said diodes in parallel with said third winding.

4. The combination as set forth in claim 1, wherein said converting means includes an automatic gain control circuit, said automatic gain control circuit comprising a rectifier and a capacitor across which said direct current voltage signal is developed.

5. The combination as set forth in claim 1 wherein said converting means includes a half-wave rectifier.

References Cited in the file of this patent

UNITED STATES PATENTS

| | | |
|---|---|---|
| 2,215,777 | Benz | Sept. 24, 1940 |
| 2,331,360 | Tuckerman | Oct. 12, 1943 |
| 2,554,905 | Hawkins | May 29, 1951 |
| 2,722,600 | Forbes | Nov. 1, 1955 |
| 2,772,388 | Erath | Nov. 27, 1956 |
| 2,820,855 | Sherr | Jan. 21, 1958 |

UNITED STATES PATENT OFFICE
CERTIFICATE OF CORRECTION

Patent No. 3,030,587

April 17, 1962

George Gautherin

It is hereby certified that error appears in the above numbered patent requiring correction and that the said Letters Patent should read as corrected below.

Column 1, line 58, after "direct" insert -- current --.

Signed and sealed this 7th day of August 1962.

(SEAL)
Attest:

ERNEST W. SWIDER
Attesting Officer

DAVID L. LADD
Commissioner of Patents